US010832987B2

(12) United States Patent
Arvin et al.

(10) Patent No.: US 10,832,987 B2
(45) Date of Patent: Nov. 10, 2020

(54) MANAGING THERMAL WARPAGE OF A LAMINATE

(71) Applicant: INTERNATIONAL BUSINESS MACHINES CORPORATION, Armonk, NY (US)

(72) Inventors: Charles L. Arvin, Poughkeepsie, NY (US); Marcus E. Interrante, Highland, NY (US); Thomas E. Lombardi, Poughkeepsie, NY (US); Hilton T. Toy, Hopewell Junction, NY (US); Krishna R. Tunga, Wappingers Falls, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 20 days.

(21) Appl. No.: 15/934,972

(22) Filed: Mar. 24, 2018

(65) Prior Publication Data

US 2019/0295921 A1    Sep. 26, 2019

(51) Int. Cl.
*H01L 23/373* (2006.01)
*H05K 1/02* (2006.01)
*H01L 23/42* (2006.01)
*H01L 23/538* (2006.01)
*H01L 23/00* (2006.01)

(52) U.S. Cl.
CPC ......... *H01L 23/3735* (2013.01); *H01L 23/42* (2013.01); *H01L 23/5389* (2013.01); *H01L 24/27* (2013.01); *H01L 24/29* (2013.01); *H01L 24/30* (2013.01); *H01L 24/32* (2013.01); *H01L 24/33* (2013.01); *H05K 1/0271* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 6,949,404 B1 | 9/2005 | Fritz et al. | |
| 7,459,782 B1 | 12/2008 | Li | |
| 7,538,432 B1 | 5/2009 | Danovitch et al. | |
| 7,898,076 B2 | 3/2011 | Furman et al. | |
| 9,012,269 B2 | 4/2015 | Jin et al. | |

(Continued)

OTHER PUBLICATIONS

"A method of reducing the TIM BLT using a jig", disclosed anonymously, IPCOM000247995D, Oct. 14, 2016, all pages.
(Continued)

*Primary Examiner* — Alexander G Ghyka
(74) *Attorney, Agent, or Firm* — Law Offices of Ira D. Blecker, P.C.

(57) ABSTRACT

A method of managing thermal warpage of a laminate which includes: assembling a stiffener and an adhesive on the laminate, the stiffener being a material that has a higher modulus of elasticity than the laminate; applying a force to deform the laminate a predetermined amount; heating the laminate, stiffener and adhesive to a predetermined temperature at which the adhesive cures to bond the stiffener to the laminate; cooling the laminate, stiffener and adhesive to a temperature below the predetermined temperature, the laminate maintaining its deformed shape.

16 Claims, 7 Drawing Sheets

(56) References Cited

U.S. PATENT DOCUMENTS

| | | |
|---|---|---|
| 9,129,942 B2 | 9/2015 | Blackshear |
| 9,673,172 B2 | 6/2017 | Maydar et al. |
| 2007/0071583 A1 | 3/2007 | Ong |
| 2012/0224335 A1* | 9/2012 | Yuan .................. H01L 23/3121 361/749 |
| 2017/0170086 A1 | 6/2017 | Iruvanti et al. |

OTHER PUBLICATIONS

"Method for an integrated solution to reliability and coplanarity issues on BGA packages with small pitch, large package, large die, and highspeed chips", disclosed anonymously, IPCOM000009095D, Aug. 7, 2002, all pages.

* cited by examiner

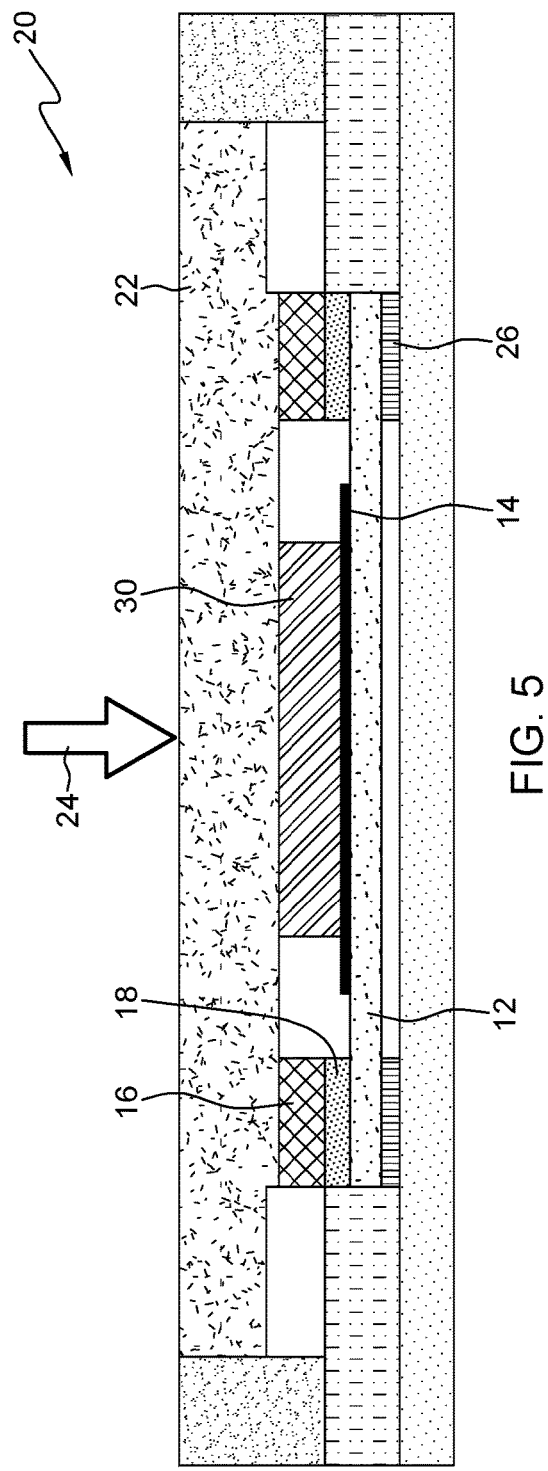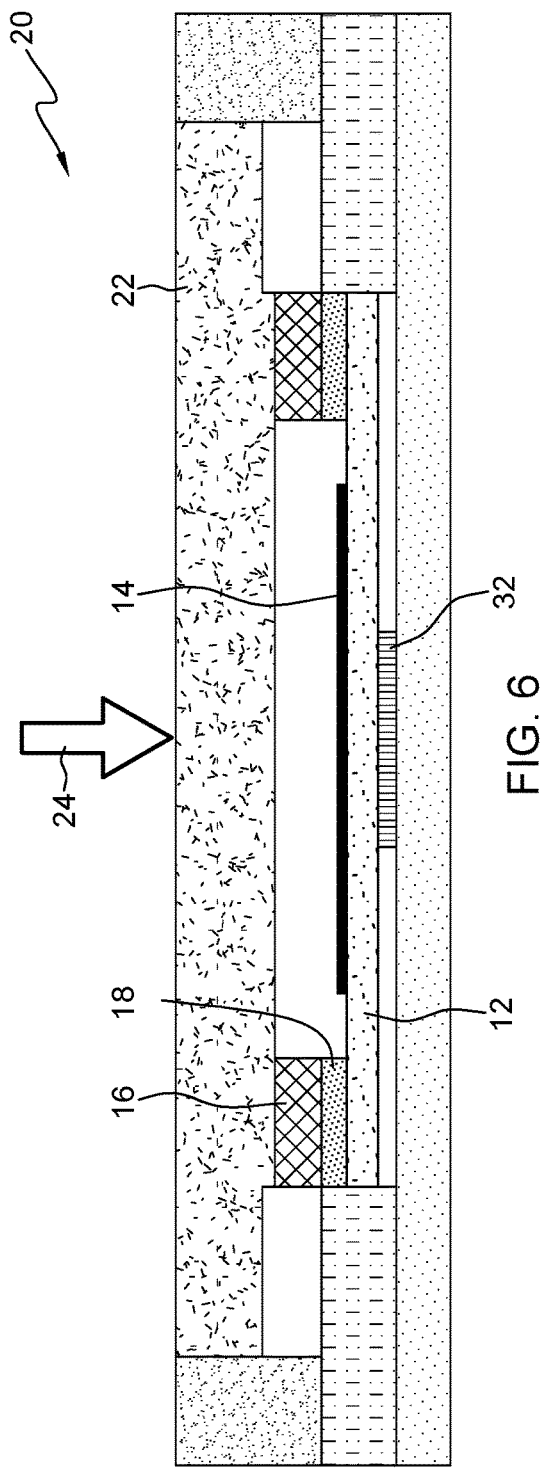

MANAGING THERMAL WARPAGE OF A LAMINATE

BACKGROUND

The present exemplary embodiments pertain to managing thermal warpage in laminate substrates so that the laminate substrates have close to zero warpage at chip join temperatures.

An organic laminate substrate, often referred to also as a printed wiring board, and hereafter referred as just "laminate", is assembled by stacking layers of substrate materials. The materials from which each of these layers are formed may be quite diverse, some layers for instance being metal, such as copper, while other layers may be nonmetallic and made from materials such as an epoxy resin and glass or fiberglass fibers. The coefficient of thermal expansion (CTE) for these individual layers may be considerably different which may invite a thermally induced substrate surface distortion, hereafter referred to as thermal warpage.

A high degree of flatness is expected for manufactured organic laminates in order to reduce, for example, connection failures when mounting components such as chips on the organic laminate. During fabrication of organic electronic modules, particularly those modules using thin core and coreless laminates, it is very important that the laminate remain as flat as possible in the chip site area during chip join reflow. Failure to keep the laminate flat can result in solder bridging (shorts) as well as chip interconnect opens. Die stresses can also result from variations in the laminate shape during chip join reflow.

Reducing thermal warpage is important to the design of the organic laminate and assembly process of mounting components on the organic laminate. Laminate warpage shows itself in a variety of shapes and each shape affects the bond and assembly process in a different way. This variety in shape is seen within the same part number laminate and can depend on what location of the panel from which the laminate was cut.

BRIEF SUMMARY

The various advantages and purposes of the exemplary embodiments as described above and hereafter are achieved by providing, according to an aspect of the exemplary embodiments, a method of managing thermal warpage of a laminate comprising: assembling a stiffener and an adhesive on the laminate, the stiffener being a material that has a higher modulus of elasticity than the laminate; applying a force to deform the laminate a predetermined amount; heating the laminate, stiffener and adhesive to a predetermined temperature at which the adhesive cures to bond the stiffener to the laminate; cooling the laminate, stiffener and adhesive to a temperature below the predetermined temperature, the laminate maintaining its deformed shape.

According to another aspect of the exemplary embodiments, there is provided a method of managing thermal warpage of an organic laminate, the method comprising: assembling a metallic stiffener and an adhesive on the organic laminate to form a laminate assembly, the metallic stiffener being a material that has a higher modulus of elasticity than the laminate, the metallic stiffener chosen to have a coefficient of thermal expansion (CTE) similar to that of the laminate at a temperature range above a glass transition temperature (Tg) of the organic laminate; applying a force perpendicular to a plane of the laminate to deform by a predetermined amount the laminate in a direction perpendicular to the plane of the laminate; heating the laminate assembly to a predetermined temperature above the Tg of the laminate at which predetermined temperature the adhesive cures to bond the stiffener to the laminate; and cooling the and laminate assembly to a temperature less than the Tg, the laminate maintaining its deformed shape after cooling to the temperature less than the Tg.

According to a further aspect of the exemplary embodiment, there is provided a method of managing thermal warpage of a laminate comprising: determining a baseline thermal warpage of the laminate comprising: modeling a thermal warpage of the laminate having a stiffener over a temperature range of room temperature to a chip join temperature, the stiffener being a material that has a higher modulus of elasticity than the laminate; measuring a room temperature warpage of the laminate and stiffener; assembling the stiffener and an adhesive on the laminate; applying a force to deform the laminate a predetermined amount to drive the thermal warpage at a solder reflow temperature to zero, plus or minus 20 μm, the predetermined amount determined from the baseline thermal warpage; heating the laminate, stiffener and adhesive to a curing temperature of the adhesive at which the adhesive cures to bond the stiffener to the laminate; and cooling the laminate substrate, stiffener and adhesive to a temperature below the predetermined temperature, the laminate maintaining its deformed shape.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 5 is an illustration of a fixture in which a concave shape may be forced on the laminate.

FIG. 6 is an illustration of a fixture in which a convex shape may be forced on the laminate.

DETAILED DESCRIPTION

The exemplary embodiments pertain to managing the thermal warpage of the laminate such that the chip site area of the laminate is flat or nearly flat during the molten solder range of the reflow cycle during chip join.

Figure 1:
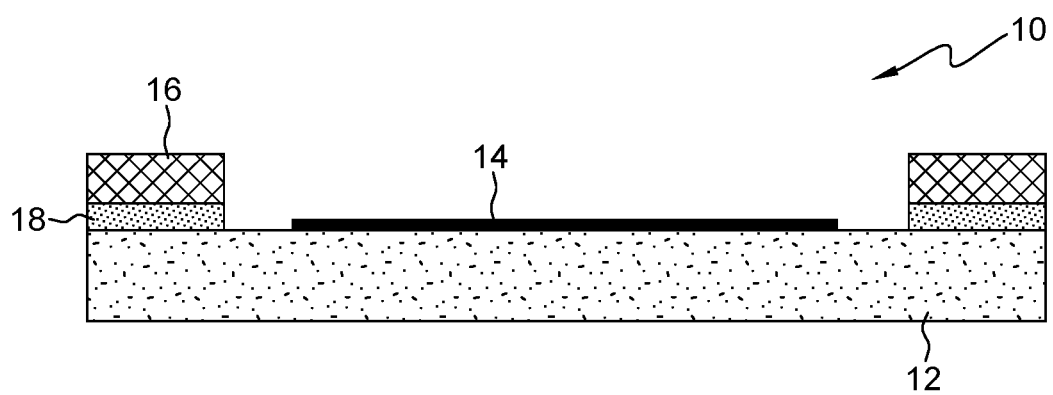
FIG. 1 is an illustration of an exemplary laminate assembly which may include an organic laminate having a chip site area.

FIG. 1 is an illustration of an exemplary laminate assembly 10 which may include an organic laminate 12 having a chip site area 14. Attached to a perimeter of the laminate 12 is a stiffener 16. The stiffener 16 may be attached to the laminate 12 by a suitable adhesive 18.

A stiffener is a material that has a higher modulus of elasticity, also known as Young's modulus, than the laminate so as to restrain out of plane deformation of the laminate.

By forcing a certain laminate shape during the attach of the perimeter stiffener to the laminate followed by adhesive cure and selecting a stiffener material with a CTE tuned to the laminate CTE, the warpage of the laminate during chip join may be accurately predicted and manipulated to have a flat or nearly flat shape during melting/solidification of the chip solder.

By using modeling and material properties of both the laminate and the stiffener, the thermal warpage of a laminate with stiffener may be predicted. The thermo-mechanical model used for modeling contains a stiffener that is attached in the fanout (peripheral) region of the laminate using an adhesive material. The entire assembly of laminate, stiffener and adhesive is assumed to be stress-free at the adhesive curing temperature. The model is then subjected to a cool down loading from the stress-free temperature to room temperature. The laminate warpage can then be extracted during the cool down process. The change in laminate warpage between the adhesive curing temperature and room temperature is called as thermal warpage. Depending on the material properties of the laminate and the CTE of the laminate, a corresponding stiffener material with known CTE may be selected that may give as flat a thermal response as possible during chip join reflow.

With the use of a fixture, preferably, during stiffener attach, the shape of the laminate with stiffener may be dialed in so that not only does the laminate with stiffener give a flat or nearly flat thermal response during chip join reflow, the thermal warpage at solder reflow temperature may be tuned to be close to zero.

Figure 2:
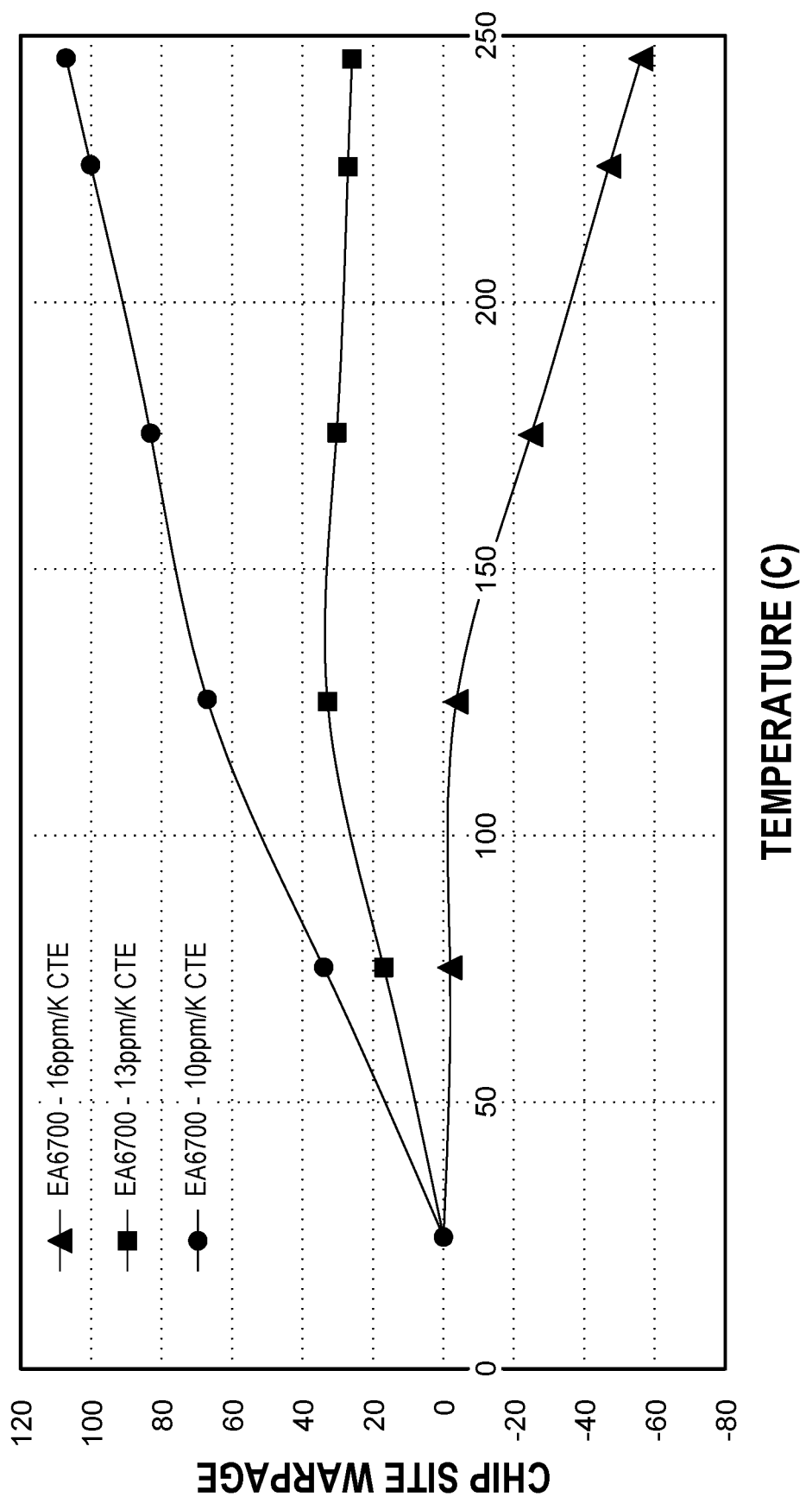
FIG. 2 is an illustration of modeling of the chip site thermal warpage for a 37.5 mm chip scale package (CSP) with three different stiffeners of varying CTE.

Referring now to FIG. 2, there is shown modeling of the chip site thermal warpage for a 37.5 mm chip scale package (CSP) with three different stiffeners of varying CTE. The stiffeners shown in FIG. 2 may have a CTE of 16 ppm/° K (parts per million per degree Kelvin), 13 ppm/° K or 10 ppm/° K. For purposes of illustration and not limitation, the stiffener having a CTE of 16 ppm/° K may be 300 series stainless steel, the stiffener having a CTE of 13 ppm/° K may be nickel or nickel alloy and the stiffener having a CTE of 10 ppm/° K may be a 400 series stainless steel.

The CTE of the laminate varies throughout the temperature range of interest, namely, room temperature to the chip join temperature while the CTE of the stiffener preferably remains constant. Negative thermal warpage corresponds to convex chip site thermal warpage while positive thermal warpage corresponds to concave thermal warpage. That is, the laminate plus 16 ppm/° K stiffener results in convex chip site thermal warpage while the laminate plus the 13 ppm/° K or 10 ppm/° K stiffener results in concave chip site thermal warpage. The inflection point at 125° C. in FIG. 2 corresponds with the glass transition temperature (Tg) of the laminate and a change in CTE.

Adding the stiffener to the laminate prior to chip join helps to normalize the highly variable warpage of the incoming laminate but does not necessarily set it at zero.

However, getting the room temperature thermal warpage to be zero is not the target of the exemplary embodiments. Rather, getting the thermal warpage as close to zero as possible during reflow of the solder interconnect is the target of the exemplary embodiments.

Figure 3:
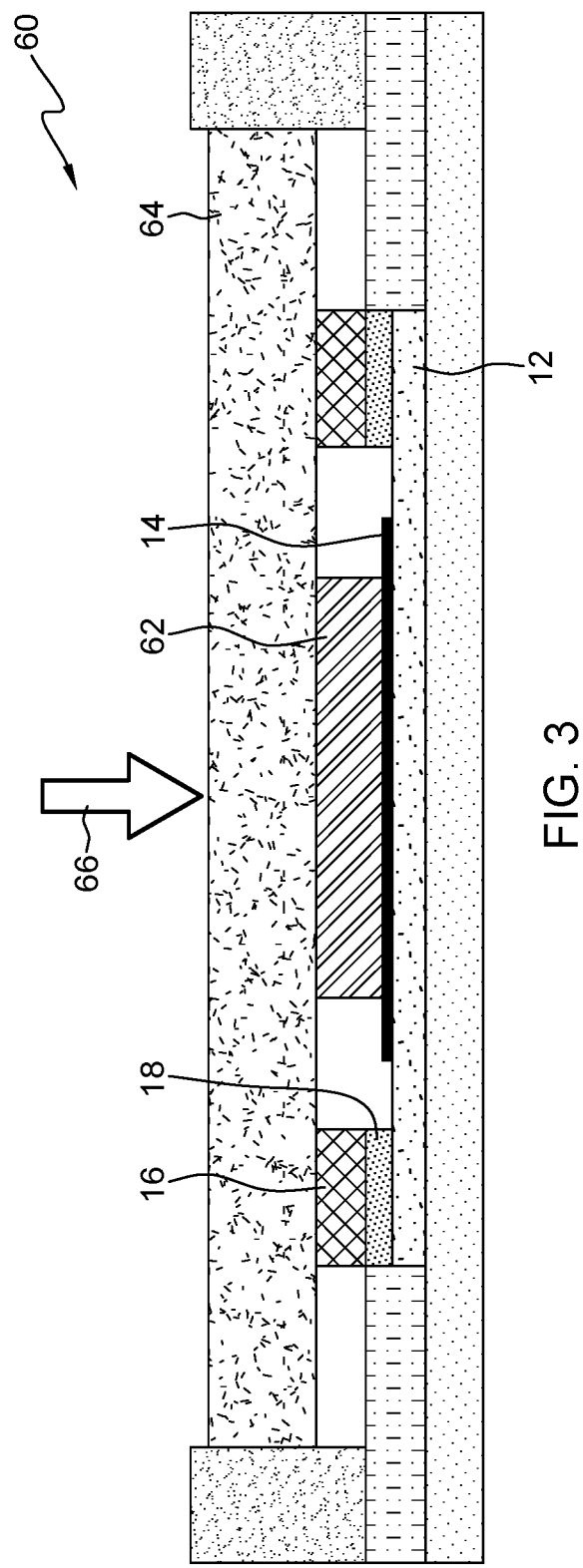
FIG. 3 is a fixture for holding a laminate flat during stiffener attach.

FIG. 3 illustrates a fixture 60 in which a stiffener 16 has been attached by an adhesive 18 to a laminate 12. The laminate 12 was held flat during stiffener attach and adhesive cure by applying a force 66 to pusher pad 64 and pusher block 62. After cooling to room temperature, the laminate 12 and adhered stiffener 16 are removed from the fixture 60.

Figure 4:
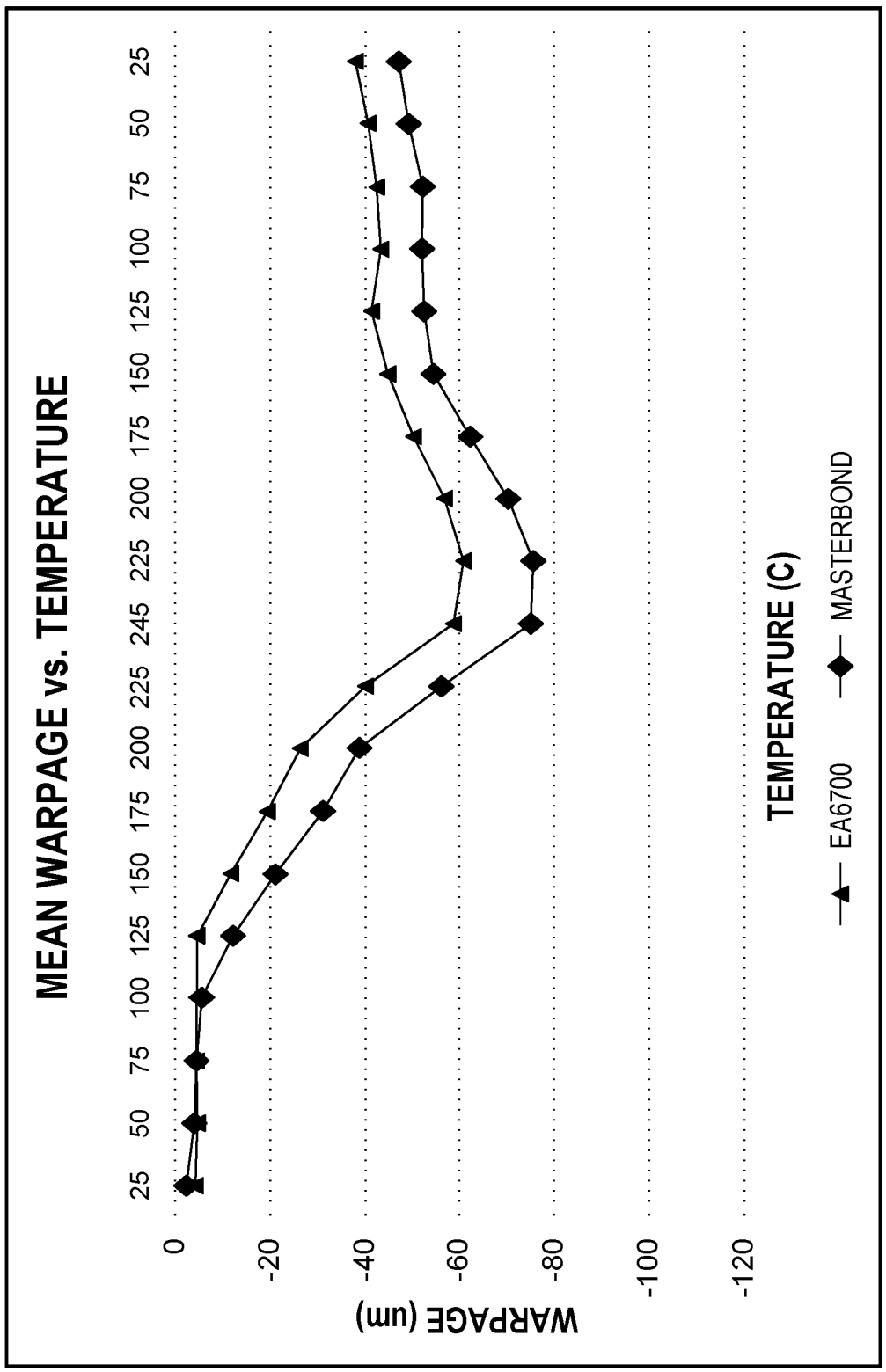
FIG. 4 is an illustration of actual digital image correlation (DIC) thermal warpage curves of a 37.5 mm CSP with a 304 stainless steel stiffener, when using a fixture for holding the laminate flat during stiffener attach.

FIG. 4 illustrates actual digital image correlation (DIC) thermal warpage curves of a 37.5 mm CSP with a 304 stainless steel stiffener, approximately 0.6 mm thick, having a CTE of 17 ppm/° K. Each of the curves in FIG. 4 uses the same laminate and stiffener but with different adhesives to join the stiffener to the laminate. Each of the laminates was held flat during stiffener attach and adhesive cure as described previously with respect to FIG. 3. The curves in FIG. 4 illustrate thermal warpage of a loose, unrestrained laminate/stiffener assembly after the stiffener adhesive has cured and been removed from any fixturing that may be used during adhesive cure.

The EA6700 adhesive is a low modulus silicone-based adhesive and is manufactured by Dow Corning Corp. The Masterbond® adhesive is a high modulus epoxy-based adhesive and is manufactured by Master Bond Inc. These are commercially available adhesives that may be used in the assembly of electronic substrates. The adhesives shown in FIG. 4 are for purposes of illustration and not limitation and other adhesives, now available or later invented, may be used to attach the stiffener to the laminate. The Masterbond and EA6700 adhesives are liquid dispense adhesives and are moderately tacky when dispensed but need to be cured at elevated temperatures for full adhesion. Sheet adhesives that may be tacky on one or both sides may also be used in the exemplary embodiments.

As can be seen from FIG. 4, the thermal warpage of a laminate may vary with the adhesive used to attach the stiffener to the laminate. And, as seen in FIG. 2, the thermal warpage of a laminate may also vary with the stiffener due to the mismatch in CTE between the stiffener and the laminate.

The thermal warpage curves may be shifted up or down such that the thermal warpage may be near zero at reflow temps by forcing a certain shape during stiffener attach and having the stiffener lock it in during adhesive cure. This can be accomplished by using a force applied, preferably by a fixture, with a perimeter shim under the laminate to force a concave shape when there is anticipated convex thermal warpage or a central shim under the laminate to force a convex shape when there is anticipated concave thermal warpage.

FIG. 5 illustrates an exemplary embodiment of a fixture 20 that may be used in which a concave shape may be forced on the laminate 12. The laminate 12 with the uncured adhesive 18 and stiffener 16 is placed in the fixture 20. Underneath the perimeter of the laminate 12 are shims 26 (for example, 5 mil thick). In the center of the laminate 12 may be placed a pusher block 30 which may be rubber or other suitable material. On top of the fixture 20 may be placed a pusher pad 22. The fixture 20 with the other components is heated to a curing temperature of the adhesive 18 while a force 24 is applied to deform the laminate 12 a predetermined amount. The force 24 may be any type of force such as a pneumatic force, spring force or magnetic force. After cooling down to a temperature below Tg of the laminate, and usually to room temperature, with the force 24 applied, the laminate 12 maintains the concave shape. There may be springback of the laminate 12 after the force 24 is removed. The springback may be up to about 50%. For example, in one experiment, the springback was about 60 µm when a 125 µm shin was used.

The amount that the laminate needs to be deformed may be derived from curves such as that shown in FIGS. 2 and 4. Modeling such as that shown in FIG. 2 may be used coupled with a room temperature warpage measurement of the laminate plus stiffener plus adhesive. Modeling may assume the warpage is zero at room temperature which may not be correct. Accordingly, the room temperature warpage measurement and how much it deviates from zero warpage may need to be considered.

The modeling, described with respect to FIG. 2, will predict the thermal warpage, i.e. the deviation in relative warpage value from room temperature to reflow temperature, assuming the warpage at room temperature is zero. Since the room temperature warpage may not be zero, even though it may be close to zero as shown for example in FIG. 4, there may be the need to measure it. Combining the absolute room temperature warpage measurement with the relative amount of predicted thermal warpage from modeling, the amount may be determined that may be needed to shift the thermal warpage curve up or down to ensure the thermal warpage is near zero at reflow temperature. The room temperature warpage measurement of the laminate/stiffener/adhesive assembly ideally may be done with an assembly in which the stiffener was attached using the fixture shown in FIG. 3 where everything is held flat. In this case, the amount of deformation required is simply the room temperature warpage combined with the predicted thermal warpage at reflow temp from modeling to achieve zero thermal warpage. The foregoing relationship may be stated in the following equation:

Zero thermal warpage=0=Room Temp Warpage+
Thermal Warpage@Reflow Temp+Deformation.

The equation may be solved to determine the correct amount of deformation needed for zero thermal warpage.

Any springback after the stiffener is attached may need to be considered when determining how thick a shim to use for the deformation. Calculating the shim thickness to be used in the deformation fixture, for example the fixtures shown in FIGS. 5 and 6, would then be just be Deformation+Springback.

If the room temperature warpage measurement is done on an assembly that was created already using a shim to deform the assembly, then the shim thickness used when creating this assembly must be taken into account when determining the final shim thickness needed for the correct deformation.

If using modeling and room temperature warpage to determine deformation, it is advisable to, in addition, use the DIC curves such as those shown in FIG. 4 to ensure the warpage is in an acceptable range at reflow temperatures.

FIG. 6 illustrates an exemplary embodiment of a fixture 20 that may be used in which a convex shape may be forced on the laminate 12. The laminate 12 with the uncured adhesive 18 and stiffener 16 is placed in the fixture 20. Underneath the center of the laminate 12 is a shim 32 (for example, 5 mil thick). On top of the fixture 20 may be placed a pusher pad 22. The fixture 20 with the other components is heated to a curing temperature of the adhesive 18 while a force 24 is applied to deform the laminate 12 a predetermined amount. The force 24 may be any type of force such as a pneumatic force, spring force or magnetic force. After cooling down to a temperature below Tg of the laminate, and usually room temperature, with the force 24 applied, the laminate 12 maintains the concave shape. There may be springback of the laminate 12 after the force 24 is removed as described previously.

Figure 7:
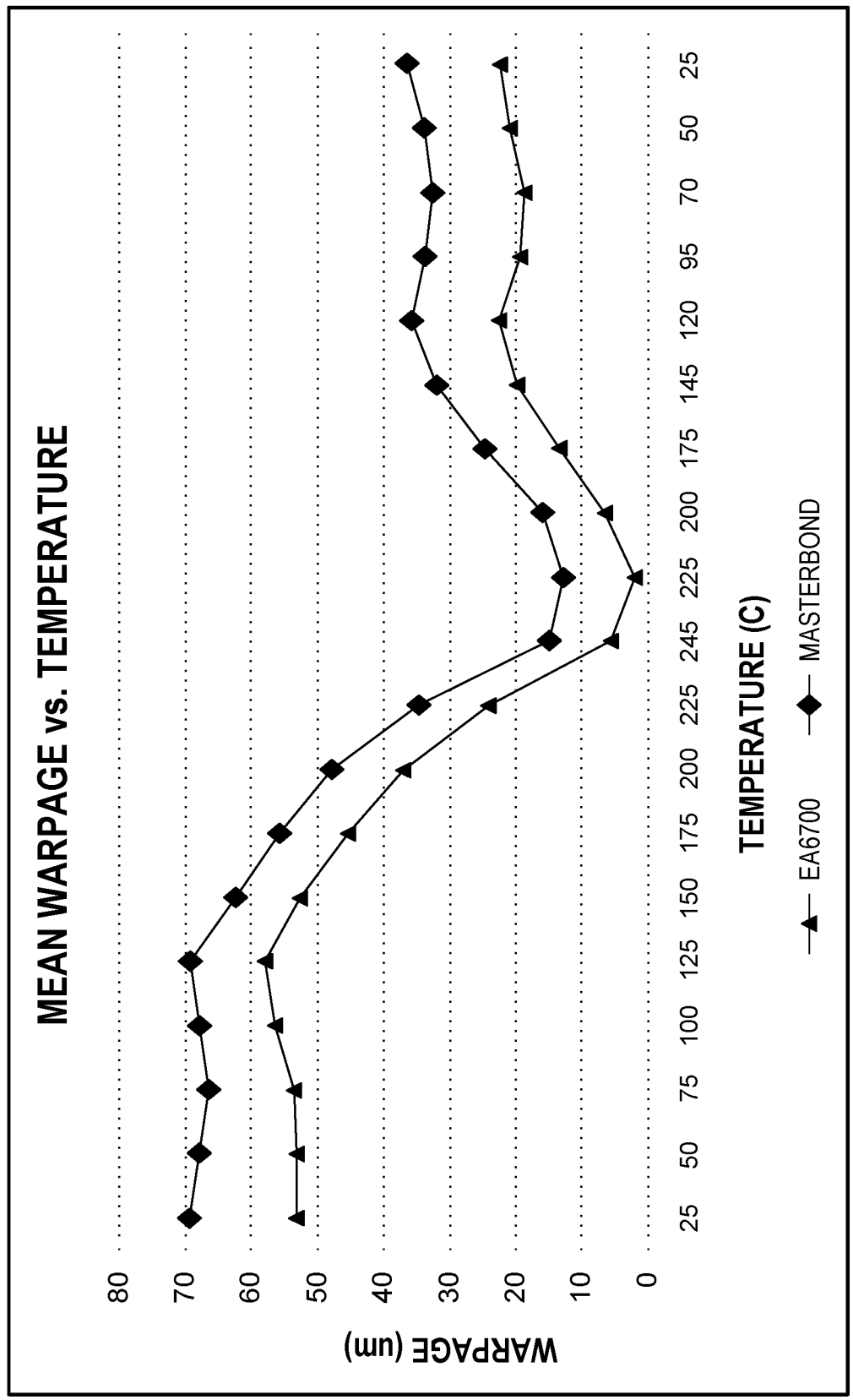
FIG. 7 is an illustration of DIC curves that show the thermal warpage when using a 5 mil perimeter shim under the laminate during stiffener attach and forcing a concave shape at room temperature.

Referring now to FIG. 7, the DIC curves show the thermal warpage of laminates after being deformed and removed from the fixture. That is, the laminates were deformed to be concave using a 5 mil perimeter shim under the laminate during stiffener attach, cooled to room temperature, removed from the fixture shown in FIG. 5 and then were heated again for chip join without being in the fixture so that any thermal warpage of the laminate would not be constrained by a fixture.

The amount of thermal warpage at the chip join temperature of 245° C. is less than 20 µm for the laminate/adhesive/stiffener combinations described with respect to FIG. 4 after a concave shape was forced on the laminate.

The amount of shift (i.e., shim thickness) may need to be optimized for a given material set so as to take into account the amount of needed deformation and any springback of the laminate.

Figure 8:
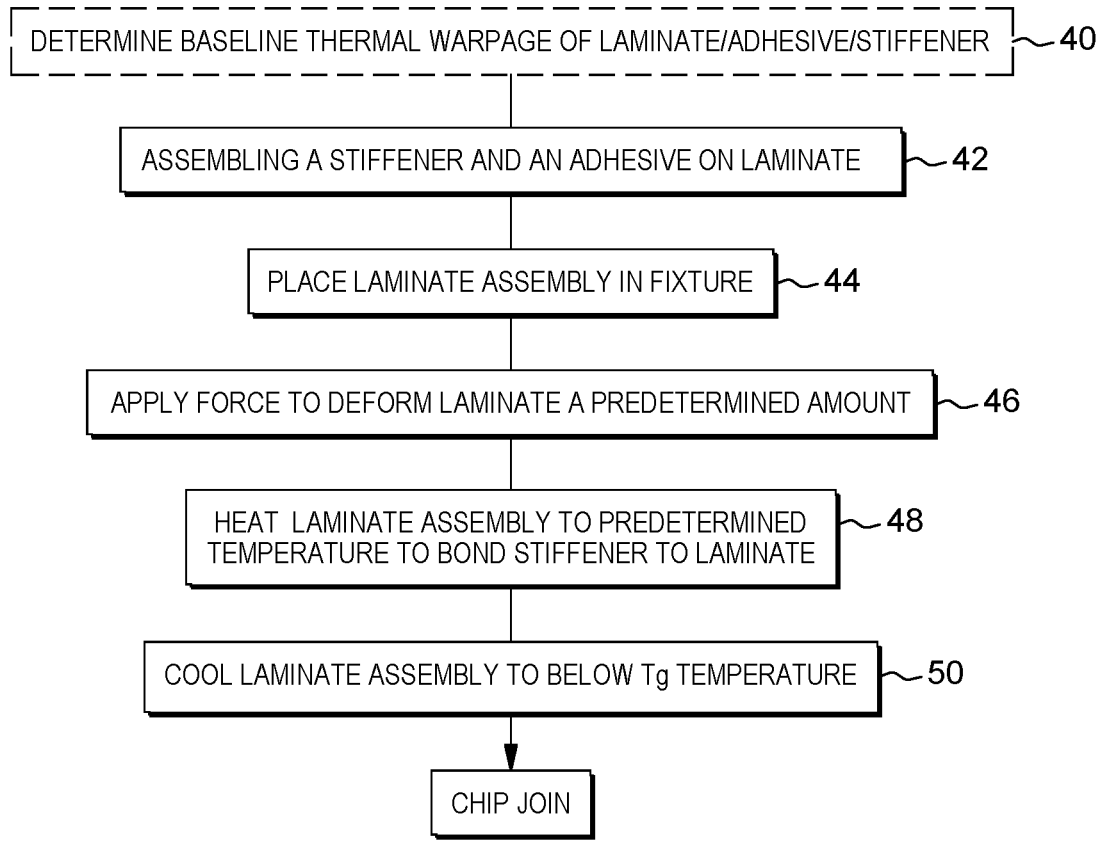
FIG. 8 is an illustration of a method of the exemplary embodiments in which thermal warpage of a laminate is managed.

Referring now to FIG. 8, there is illustrated a method of the exemplary embodiments in which thermal warpage of a laminate is managed. The laminate may be an organic laminate as described previously having a plurality of nonmetallic layers having metallic wiring.

If not already known, there may need to be a baseline determination of the thermal warpage characteristics of the laminate, adhesive and stiffener before the laminate is deformed, box 40, for example as previously shown in FIG. 4.

This baseline determination may be done by using modeling (such as shown in FIG. 2), factoring in the room temperature warpage, and then if necessary, fine tuning the amount of deformation required by using experimental means and measuring with DIC as demonstrated by the curves shown in FIG. 4.

A stiffener and an adhesive may be placed on the laminate substrate to form a laminate assembly, box 42. The stiffener is preferably a stainless steel, copper or aluminum stiffener and may be chosen to have a coefficient of thermal expansion (CTE) similar to that of the laminate substrate preferably at a temperature range above the glass transition temperature of the nonmetallic layers of the laminate substrate to the temperature of chip join. A metallic stiffener is preferred since it may have a constant CTE through the temperature range of above the glass transition temperature of the nonmetallic layers of the laminate substrate through the chip join temperature. The stiffener may have a thickness of about 0.6 to 1 mm.

The CTE of the stiffener should match the CTE of the laminate as closely as possible (±1 ppm). Ideally the CTE of the stiffener should be matched to that of the laminate when the laminate is just above the Tg temperature since this will give the flattest thermal response at reflow temperature (not just absolute warpage magnitude at reflow temp but also rate of warpage change for temperature variations around the reflow temperature) and provide the largest process window. Referring back to FIG. 2, the curve representing the stiffener/adhesive having a CTE of 13 ppm/° K has the flattest thermal response above the glass transition temperature. Since this stiffener/adhesive combination is about 30 µm above the ideal zero thermal warpage at the chip join temperature, the curve may be shifted toward zero thermal warpage by deforming the laminate so as to have a convex configuration using the fixture of FIG. 6.

The laminate assembly preferably may be placed in a suitable fixture to hold the laminate while it is deformed, box 44. The fixture may be a fixture such as that shown in FIGS. 5 and 6.

A force is applied to deform the laminate by a predetermined amount, box 46. The force may be applied perpendicular to a plane of the laminate to deform the laminate the predetermined amount in a direction perpendicular to the plane of the laminate.

The fixture and laminate assembly may be heated to a predetermined temperature at which the adhesive cures to bond the stiffener to the laminate, box 48. The predetermined temperature is above the Tg of the laminate and may be, for example, 150° C. for 1 hour. The predetermined temperature and cure time is dependent on the recommended curing conditions of the adhesive used, but a typical range may be 150° C.±10° for 1 hour±10%.

The fixture and laminate assembly may then be cooled below the Tg temperature of the laminate, preferably to room temperature, box 50. Cooling may be simply removing the fixture and laminate assembly from the heating source in which the fixture and laminate assembly were heated and allowing the fixture and laminate assembly to cool below the Tg temperature. Alternatively, cooling may be actively cooling the fixture and laminate by, for example, blowing cool air on the fixture and laminate.

After cooling, the laminate will maintain its deformed shape. The laminate and adhered stiffener may be removed from the fixture after cooling if a fixture was used to apply the force. The stiffener remains as a permanent part of the laminate assembly.

Figure 9:
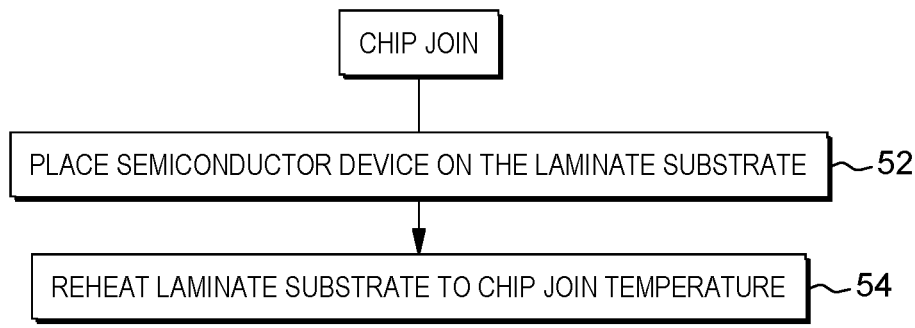
FIG. 9 is an illustration of a method of the exemplary embodiments in which a chip is bonded to the laminate.

The next set of process steps may be for an exemplary embodiment for chip joining which are described with reference to FIG. 9.

A chip (may also be referred to as a semiconductor device) may be positioned on the chip site of the laminate substrate, box 52. For purposes of illustration and not limitation, the chip may be a so-called flip chip and have a plurality of solder balls to be joined to the laminate by a C4 connection.

The laminate and chip may be reheated to the chip join temperature, for example 245° C., to cause reflowing of the solder so as to join the chip to the laminate, box 54. In this step, the laminate and chip are not in a fixture such as that in FIGS. 5 and 6.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of managing thermal warpage of a laminate comprising:
    assembling a stiffener and an adhesive on the laminate, the stiffener being a material that has a higher modulus of elasticity than the laminate;
    applying a force to deform the laminate a predetermined amount so as to drive the thermal warpage of the laminate at a solder reflow temperature of a semiconductor chip joined to the laminate during a subsequent semiconductor chip joining process to zero, plus or minus 20 μm, the predetermined amount related to the thermal warpage of the laminate due to the stiffener and the thermal warpage of the laminate due to the adhesive;
    heating the laminate, stiffener and adhesive to a predetermined temperature at which the adhesive cures to bond the stiffener to the laminate; and
    cooling the laminate, stiffener and adhesive to a temperature below the predetermined temperature, the laminate maintaining its deformed shape.

2. The method of claim 1 wherein applying the force causes the laminate to have a convex shape.

3. The method of claim 1 wherein applying the force causes the laminate to have a concave shape.

4. The method of claim 1 wherein the stiffener is only on a periphery of the laminate.

5. The method of claim 1 further comprising placing at least one shim underneath the laminate when applying the force.

6. The method of claim 1 wherein the steps of applying the force, heating the laminate, stiffener and adhesive and cooling the laminate, stiffener and adhesive are in a fixture and further comprising:
    removing the laminate, stiffener and adhesive from the fixture;
    placing a semiconductor chip on the laminate; and
    reheating the laminate to a temperature sufficient to cause the semiconductor chip to bond to the laminate substrate.

7. A method of managing thermal warpage of a laminate comprising:
    assembling a stiffener and an adhesive on the laminate, the stiffener being a material that has a higher modulus of elasticity than the laminate,
    wherein the laminate is an organic laminate having a glass transition temperature (Tg) and wherein the stiffener is a metallic stiffener that has a coefficient of thermal expansion (CTE) within ±1 ppm/° K of the laminate at a temperature range above the glass transition temperature of the laminate;
    applying a force to deform the laminate a predetermined amount, the predetermined amount related to the thermal warpage of the laminate due to the stiffener and the thermal warpage of the laminate due to the adhesive;
    heating the laminate, stiffener and adhesive to a predetermined temperature at which the adhesive cures to bond the stiffener to the laminate; and
    cooling the laminate, stiffener and adhesive to a temperature below the predetermined temperature, the laminate maintaining its deformed shape.

8. The method of claim 7 wherein cooling is to below the Tg temperature of the organic laminate.

9. The method of claim 7 wherein the metallic stiffener is chosen from the group consisting of stainless steel, copper and aluminum.

10. A method of managing thermal warpage of an organic laminate, the method comprising:
    assembling a metallic stiffener and an adhesive on the organic laminate to form a laminate assembly, the metallic stiffener being a material that has a higher modulus of elasticity than the laminate, the metallic stiffener chosen to have a coefficient of thermal expansion (CTE) within ±1 ppm/° k of the laminate at a temperature range above a glass transition temperature (Tg) of the organic laminate;
    applying a force perpendicular to a plane of the laminate to deform by a predetermined amount the laminate in a direction perpendicular to the plane of the laminate;
    heating the laminate assembly to a predetermined temperature above the Tg of the laminate at which predetermined temperature the adhesive cures to bond the stiffener to the laminate; and cooling the laminate assembly to a temperature less than the Tg, the laminate maintaining its deformed shape after cooling to the temperature less than the Tg.

11. The method of claim 10 wherein applying the force causes the laminate to have a convex shape.

12. The method of claim 10 wherein applying the force causes the laminate to have a concave shape.

13. The method of claim 10 wherein the stiffener is only on a periphery of the laminate.

14. The method of claim 10 further comprising placing at least one shim underneath the laminate when applying the force.

15. The method of claim 10 wherein the steps of applying the force, heating the laminate assembly and cooling the laminate assembly are in a fixture and further comprising:

removing the laminate assembly from the fixture;

placing a semiconductor chip on the laminate; and reheating the laminate to a temperature sufficient to cause the semiconductor chip to bond to the laminate substrate.

16. The method of claim 10 wherein the metallic stiffener is chosen from the group consisting of stainless steel, copper and aluminum.

* * * * *